United States Patent [19]

Scanlan et al.

[11] Patent Number: 5,690,504

[45] Date of Patent: Nov. 25, 1997

[54] PLASTIC GUIDE PIN WITH STEEL CORE

[75] Inventors: John F. Scanlan, Nashua; Gerald P. Grassett, Amherst, both of N.H.

[73] Assignee: Teradyne, Inc., Boston, Mass.

[21] Appl. No.: 645,304

[22] Filed: May 13, 1996

[51] Int. Cl.⁶ .................................................. H01R 13/629
[52] U.S. Cl. ................................................................ 439/378
[58] Field of Search ....................................... 439/378, 379

[56] References Cited

U.S. PATENT DOCUMENTS

| | | | |
|---|---|---|---|
| 4,179,178 | 12/1979 | Bachman et al. | 439/378 |
| 4,550,362 | 10/1985 | Reimer | 361/415 |
| 4,980,800 | 12/1990 | Furuta | 439/378 |

*Primary Examiner*—Gary F. Paumen
*Attorney, Agent, or Firm*—Richard E. Gamache

[57] ABSTRACT

A guide pin that mounts easily to a back plane including a hollow, elongated body molded from plastic, and a rigid, elongated steel rod. The plastic body has an opening located at one end. The rod is first inserted into a hole in the back plane. The rod is then inserted into the body through the opening. The action of inserting the rod into the back plane causes the rod to frictionally engage the hole in the back plane, thereby securing the guide pin to the back plane. The portion of the steel rod located inside the plastic body gives the guide pin sufficient strength and rigidity for most back plane assembly applications.

19 Claims, 3 Drawing Sheets

PLASTIC GUIDE PIN WITH STEEL CORE

BACKGROUND OF INVENTION

This invention relates generally to back plane assemblies, and more particularly to an assembly for positioning a daughter board relative to a back plane.

Multiple printed circuit boards are commonly connected together through another printed circuit board called a "back plane." When printed circuit boards are connected together in this fashion, they are generally known as "daughter boards."

Each daughter board is typically coupled to the back plane by at least one electrical connector. An electrical connector generally consists of two plastic housings. One plastic housing is mounted to the daughter board, while the other plastic housing is mounted to the back plane. A daughter board is connected to, or "plugged onto," the back plane by mating the connector housing on the daughter board with the connector housing on the back plane.

Electrical connectors ordinarily have many rows of signal contacts disposed within each plastic housing. Further, the signal contacts generally have tails that extend from each connector housing, and attach to either the daughter board or the back plane. In some applications, such as those requiring fast data rates, the signal contacts are very small and fragile.

In order to route electronic signals between a daughter board and the back plane, each signal contact in one connector housing must touch its corresponding signal contact in the other connector housing. This generally requires the two connector housings to be properly aligned when connection is being made. Additionally, if proper alignment is not achieved during mating of the two connector housings, the very small and fragile signal contacts may become damaged or broken. Consequently, some electronic signals may not be properly routed between the daughter board and the back plane, and equipment failure may result.

It has been recognized that one way to achieve proper alignment when plugging a daughter board onto the back plane is to provide guide pins on the back plane. Guide pins are typically mounted to the back plane so that they extend perpendicularly from the back plane. Further, at least one guide pin is generally provided for each electrical connector mounted to the daughter board. When the daughter board is plugged onto the back plane, at least one guide pin typically engages a hole located on the connector housing mounted to the daughter board.

A prior art implementation of guide pins consists of mounting steel pins to the back plane. The pins are typically made of stainless steel. Further, an important advantage of steel guide pins is that they are very strong. For example, each steel pin can generally withstand a substantial amount of side force without deflecting.

However, this approach to achieving proper alignment when plugging a daughter board onto the back plane has several drawbacks. First, each steel guide pin is commonly mounted to the back plane using a screw. Each steel guide pin is internally threaded. A screw is then inserted through a hole in the back plane, and engaged with the threads in the pin, thereby securing the steel guide pin to the back plane. This method of mounting steel guide pins to the back plane requires a substantial amount of assembly time. Second, steel guide pins of this type are relatively expensive. As a result, using steel guide pins to align a daughter board with the back plane substantially increases the cost of the back plane assembly.

Another prior art implementation of guide pins consists of mounting plastic guide pins to the back plane. Plastic guide pins function in a manner that is similar to the steel guide pins. Additionally, an important advantage of plastic guide pins is that their unit cost is generally less than of steel guide pins.

However, this approach to achieving proper alignment when plugging a daughter board onto the back plane also has a drawback. For example, guide pins made of plastic generally do not have the same amount of strength as steel guide pins. As a result, plastic guide pins may be easily damaged if a sufficient amount of force is inadvertently applied to the pins.

Although guide pins have been used successfully to ensure proper alignment while plugging a daughter board onto a back plane, it would be desirable to have a guide pin that can be easily attached to the back plane. It would also be desirable to have a guide pin that is strong, rigid, and inexpensive.

SUMMARY OF THE INVENTION

With the foregoing background in mind, it is an object of the invention to provide a guide pin for positioning a daughter board relative to a back plane that can be easily mounted to the back plane.

It is also an object to provide a guide pin for positioning a daughter board relative to a back plane that is strong and rigid, while also being inexpensive.

The foregoing and other objects are achieved in a guide pin having a hollow, elongated body including an opening at a first end; and, a rigid, elongated rod. The rod frictionally engages a hole in the back plane. The rod is then inserted into the body through the opening at the first end.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
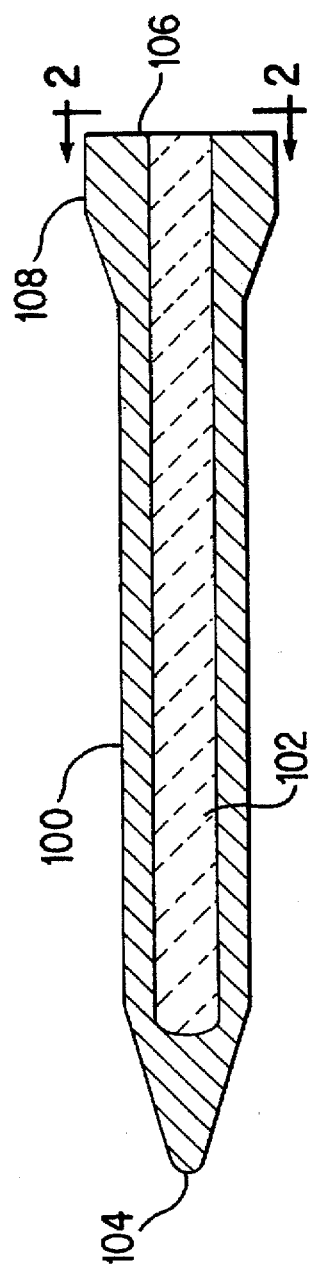
FIG. 1 shows in cross-section the hollow, elongated body of the guide pin.

FIG. 1 shows in cross-section the preferred embodiment of the body of the guide pin of the present invention. Elongated body 100 has an opening at first end 106. Further, body 100 preferably has tip 104 at a second end to facilitate the positioning of a daughter board with the back plane.

For example, in some applications, the guide pin passes through and engages a hole in an electrical connector housing mounted to the daughter board. As a result, the electrical contacts in the connector housing on the daughter board have a fixed relationship with the corresponding electrical contacts on the back plane. In other applications, the guide pin slides across the surface of either the daughter board or other device commonly found on the daughter board, thereby placing both the daughter board and device in proper alignment with the back plane. Tip 104 makes both the inserting of the guide pin into a hole, and the sliding of the guide pin across a surface, easier to accomplish.

Body 100 is provided with chamber 102, running substantially the full length of body 100, which is adapted to receive a slender rod. In the preferred embodiment, the slender rod is a steel roll pin. Body 100 also has flange 108 extending around the outer circumference of body 100.

Body 100 is preferably made of either plastic or glass reinforced nylon. This is because guide pins molded from either plastic or glass reinforced nylon are relatively inexpensive to manufacture.

Figure 2:
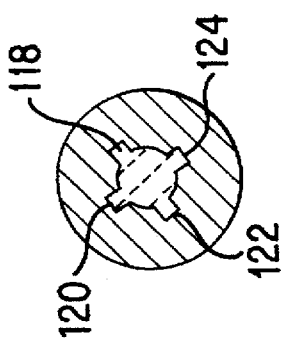
FIG. 2 shows the end of the body having an opening.

FIG. 2 shows first end 106 of body 100. The cross-section of body 100 is circular. Additionally, body 100 has longitudinal relief slots 118, 120, 122, and 124 which are shown evenly spaced around the inner circumference of body 100. Relief slots 118, 120, 122, and 124 run substantially the full length of chamber 102.

Figure 3:
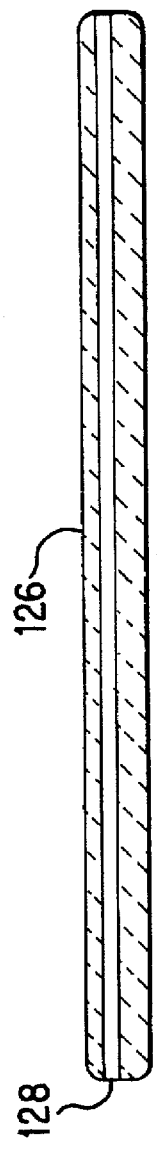
FIG. 3 shows the steel roll pin.

Turning to FIG. 3, steel roll pin 126 is shown. Steel roll pin 126 has a generally circular cross-section (not shown), and is substantially rigid. Steel roll pin 126 also has slot 128, running the full length of steel roll pin 126, which facilitates both the mounting of body 100 onto steel roll pin 126, and the mounting of steel roll pin 126 onto the back plane.

Preferably, the diameter of steel roll pin 126 is slightly larger than the effective diameter of chamber 102. As a result, when steel roll pin 126 is inserted into chamber 102 through the opening at first end 106, forces are generated which compress steel roll pin 126, thereby making slot 128 narrower and the diameter of steel roll pin 126 smaller.

Additionally, forces are generated which cause the surface of steel roll pin 126 to press against the surface defining chamber 102. Relief slots 118, 120, 122, and 124 are important features of body 100 because they distribute these forces along the full length of chamber 102, thereby preventing body 100 from being damaged. Further, these forces prevent body 100 from being easily separated from steel roll pin 126.

Figure 4:
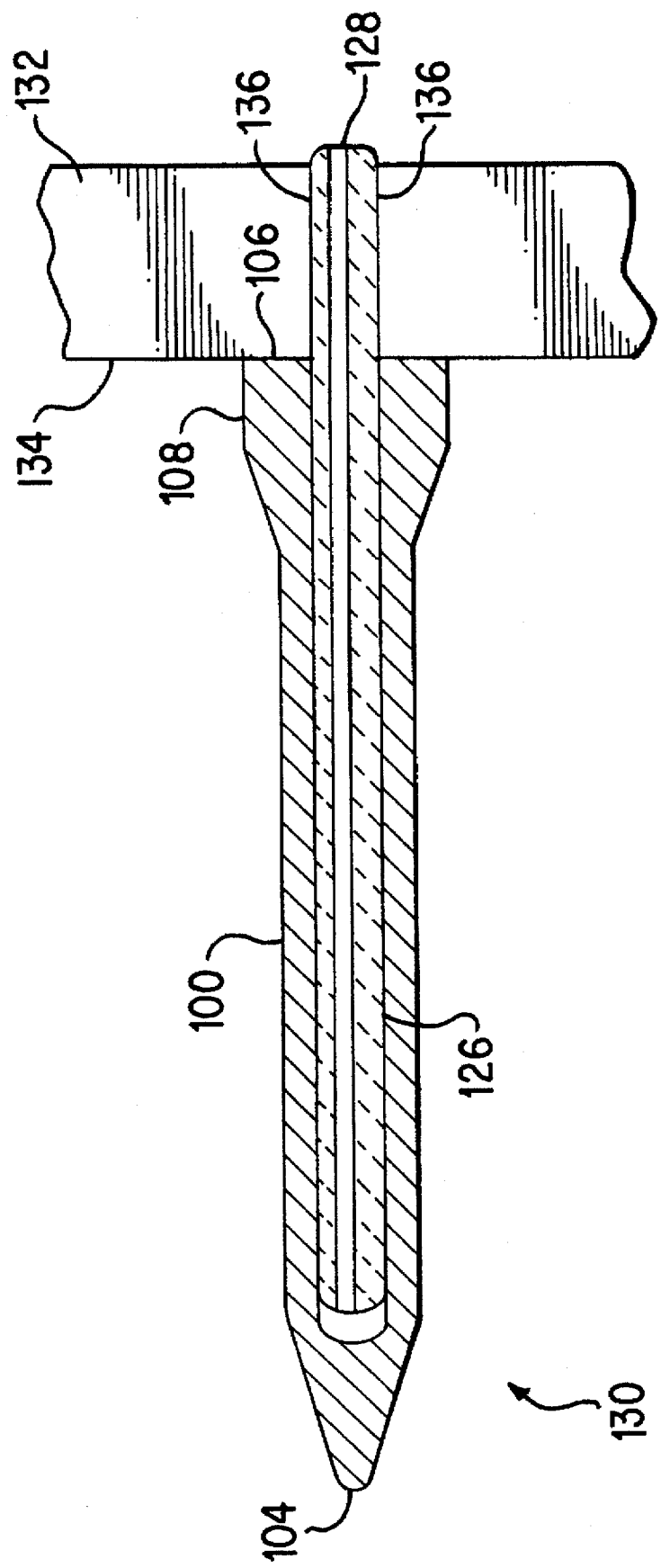
FIG. 4 shows in cross-section the steel roll pin mounted onto the back plane, and inserted into the body of the guide pin.

FIG. 4 shows guide pin 130 fully assembled and mounted to back plane 132 in accordance with the present invention. The following steps are preferably used to assemble and mount guide pin 130. First, one end of steel roll pin 126 is inserted into a hole in back plane 132 until the end protrudes slightly from the back plane. Next, body 100 is pushed onto the exposed portion of steel roll pin 126 until flange 108 touches surface 134, thereby inserting steel roll pin 126 into chamber 102 through the opening at first end 106.

The diameter of steel roll pin 126 is slightly larger than the diameter of the hole in back plane 132. As a result, when the end of steel roll pin 126 is inserted into the hole in back plane 132, forces are generated which compress steel roll pin 126, thereby causing the surface of steel roll pin 126 to press against and frictionally engage surface 136 of the hole in back plane 132. Consequently, guide pin 130 is prevented both from rotating and from being easily withdrawn from the hole. This constitutes a substantial advantage over the prior art in that a screw is not required to secure guide pin 130 to back plane 132. As a result, the time required to mount guide pin 130 to back plane 132 is decreased. Further, because machining is not required to form an internal thread in guide pin 130, the unit cost of guide pin 130 is also decreased relative to prior art implementations.

An important feature of guide pin 130 is that although body 100 is preferably made from either plastic or nylon, guide pin 130 has the strength and rigidity required for most back plane assembly applications. This is because steel roll pin 126 provides a strong and rigid core for body 100.

Figure 5:
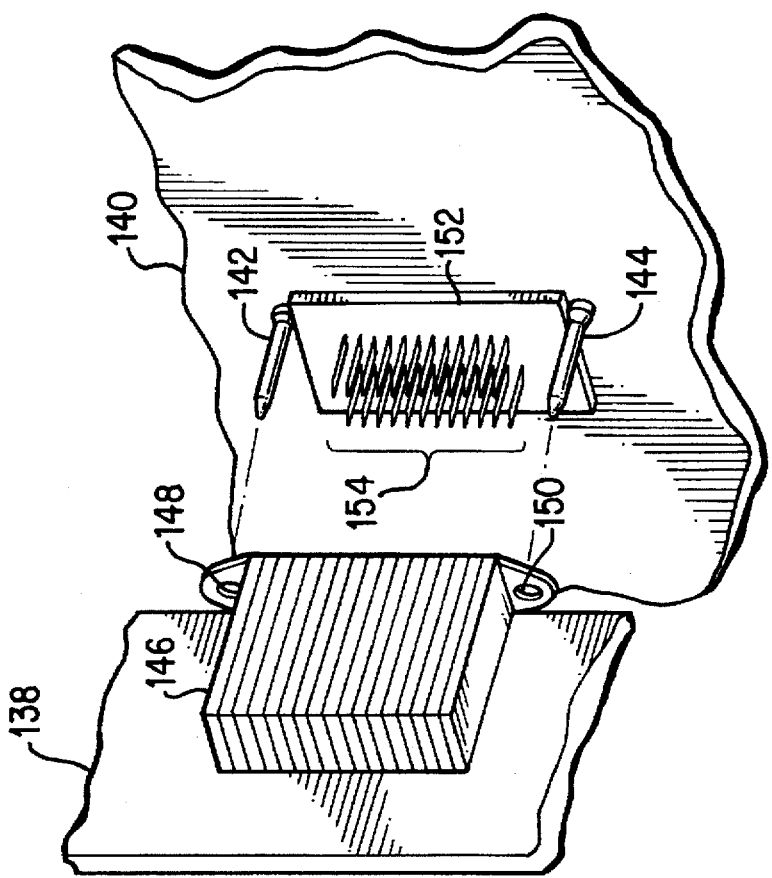
FIG. 5 is a perspective view of a daughter board partially positioned in accordance with the present invention.

FIG. 5 shows an assembly for positioning a daughter board relative to a back plane in accordance with the present invention. Daughter board 138 is shown positioned adjacent to back plane 140. Rigid back plane 140, shown vertically oriented, serves as a mounting base for guide pins 142 and 144, which extend perpendicularly from back plane 140.

For the typical application shown, electrical connector housing 146 has alignment holes 148 and 150, and is mounted to daughter board 138. Further, the electrical contacts disposed in connector housing 146 are located in respective connector receptacles (not shown). Electrical connector housing 152 is shown mounted to back plane 140. Additionally, connector pins 154 serve as the electrical contacts disposed in connector housing 152.

Figure 6:
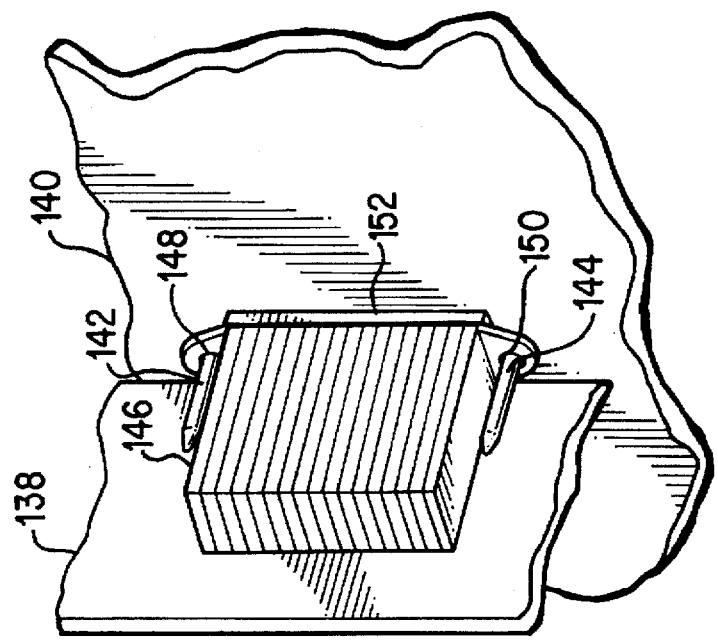
FIG. 6 is a perspective view of a daughter board fully positioned in accordance with the present invention.

Turning to FIG. 6, daughter board 138 is shown positioned relative to back plane 140 according to the present invention. When daughter board 138 is plugged onto back plane 140, guide pins 142 and 144 engage alignment holes 148 and 150, respectively, thereby permitting proper alignment of the connector receptacles relative to connector pins 154. As a result, damage to connector pins 154 is prevented. Daughter board 138 is then slid toward back plane 140, thereby mating connector housing 146 and connector housing 152. Consequently, daughter board 138 is properly positioned relative to the back plane.

Having described one embodiment, numerous alternative embodiments or variations might be made. For example, it was described that the body of the guide pin is made of either plastic or nylon. However, this implementation is merely an illustration. The body of the guide pin may be made of any material which allows the body to be easily and inexpensively manufactured.

Also, it was described that the body of the guide pin is adapted to receive a steel roll pin. However, this implementation is also merely an illustration. The body may be adapted to receive a rod made of any material which causes the guide pin to be strong and rigid, which allows the guide pin to be inexpensively manufactured, and which can fictionally engage the inner surfaces of a hole in the back plane to lock the guide pin in place.

Also, it was described that the cross-section of the guide pin is circular. However, this implementation is merely an illustration. The cross-section of the guide pin may be circular, rectangular, or any other shape which facilitates the positioning of a daughter board with the back plane.

Also, it was described that the steel roll pin is inserted into a hole in the back plane until the end of the steel roll pin protrudes slightly from the back plane, and then the body of the guide pin is pushed onto the exposed portion of the steel roll pin. However, this implementation is also merely an illustration. A steel roll pin roughly twice as long as the steel roll pin described may be inserted into the hole in the back plane until an equal length of the steel roll pin protrudes from both sides of the back plane. Next, a guide pin body may be pushed onto each exposed portion of the steel roll pin, thereby resulting in a guide pin extending perpendicularly from both sides of the back plane.

Finally, it should be appreciated that the application showing guide pins engaging holes in an electrical connector housing is merely an illustration. The invention might be used to properly align an electrical connector, a disk drive, or any other component commonly placed on a daughter board. Further, the invention might be used to properly align a daughter board with the back plane without engaging any component on the daughter board.

Therefore, the invention should be limited only by the spirit and scope of the appended claims.

What is claimed is:

1. A back plane assembly comprising:
   (a) a back plane including at least one hole;
   (b) a daughter board connected to the back plane; and
   (c) at least one guide pin mounted to the back plane, the guide pin comprising
      (i) an elongated body,
      (ii) a chamber within said body, and
      (iii) a rigid, elongated rod including a first section and a second section, said rod having the first section thereof inserted into and substantially filling said chamber, and said rod having the second section thereof passing through and engaging the hole in said back plane, thereby securing the guide pin to the back plane.

2. The back plane assembly of claim 1 wherein said body further includes a flange for properly seating the guide pin in the hole in said back plane.

3. The back plane assembly of claim 2 wherein said chamber is defined by longitudinal sides within said body, said sides including a plurality of longitudinal relief slots for evenly distributing forces caused by said rod pressing against said sides.

4. The back plane assembly of claim 3 wherein said body further includes a first end, a second end, and a tip at the second end, said first end including an opening for receiving said elongated rod.

5. The back plane assembly of claim 4 wherein said body is molded from a material selected from the group consisting of plastic and glass reinforced nylon.

6. The back plane assembly of claim 5 wherein said rod is a roll pin.

7. The back plane assembly of claim 6 wherein said roll pin is made of a material selected from the group consisting of stainless steel or carbon steel.

8. A guide pin adapted to be mounted to a printed circuit board, said printed circuit board including a hole, comprising:
   (a) an elongated body;
   (b) a chamber within said body; and
   (c) a rigid, elongated rod including a first section and a second section, said rod having the first section thereof inserted into and substantially filling said chamber, and said rod having the second section thereof adapted to pass through and engage the hole in said back plane, thereby securing the guide pin to the back plane.

9. The guide pin of claim 8 wherein said body further includes a flange for properly seating the guide pin in the hole in said printed circuit board.

10. The guide pin of claim 9 wherein said chamber is defined by longitudinal sides within said body, said sides including a plurality of longitudinal relief slots for evenly distributing forces caused by said rod pressing against said sides.

11. The guide pin of claim 10 wherein said body further includes a first end, a second end, and a tip at the second end, said first end including an opening for receiving said elongated rod.

12. The guide pin of claim 11 wherein said body is molded from a material selected from the group consisting of plastic and glass reinforced nylon.

13. The guide pin of claim 12 wherein said rod is a roll pin.

14. The guide pin of claim 13 wherein said roll pin is made of a material selected from the group consisting of stainless steel or carbon steel.

15. A method of mounting a guide pin to a printed circuit board, said guide pin including an elongated body, a chamber within said body, and a rigid, elongated rod, said body including an opening at a first end, said rod including a first section and a second section, said printed circuit board including a hole, comprising the steps of:
   (a) passing the second section of said rod through the hole of said printed circuit board, whereby the second section of said rod frictionally engages the hole; and
   (b) passing the first section of said rod through the opening at the first end of said body, until the first section of said rod is fully inserted into, and substantially fills, said chamber.

16. The method of claim 15 wherein said chamber is defined by longitudinal sides within said body, said sides including a plurality of longitudinal relief slots for evenly distributing forces caused by said rod pressing against said sides.

17. The method of claim 16 wherein said body is molded from a material selected from the group consisting of plastic and glass reinforced nylon.

18. The method of claim 17 wherein said rod is a roll pin.

19. The method of claim 18 wherein said roll pin is made of a material selected from the group consisting of stainless steel or carbon steel.

* * * * *